US011251409B2

(12) United States Patent
Yang et al.

(10) Patent No.: US 11,251,409 B2
(45) Date of Patent: Feb. 15, 2022

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jibum Yang, Beijing (CN); Wei Zhang, Beijing (CN); Cheng Zeng, Beijing (CN); Yu He, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 458 days.

(21) Appl. No.: 16/328,326

(22) PCT Filed: Apr. 4, 2018

(86) PCT No.: PCT/CN2018/081886

§ 371 (c)(1),
(2) Date: Feb. 26, 2019

(87) PCT Pub. No.: WO2019/001069

PCT Pub. Date: Jan. 3, 2019

(65) Prior Publication Data

US 2021/0296620 A1 Sep. 23, 2021

(30) Foreign Application Priority Data

Jun. 28, 2017 (CN) ........................ 201710505815.9

(51) Int. Cl.
*H01L 51/52* (2006.01)

(52) U.S. Cl.
CPC ...... *H01L 51/5284* (2013.01); *H01L 51/5218* (2013.01); *H01L 51/5234* (2013.01)

(58) Field of Classification Search
CPC ............. H01L 51/5284; H01L 51/5234; H01L 51/5218
See application file for complete search history.

(56) References Cited

U.S. PATENT DOCUMENTS

2006/0124920 A1 6/2006 Kimura
2006/0263593 A1 11/2006 Aziz et al.
(Continued)

FOREIGN PATENT DOCUMENTS

CN 1685772 A 10/2005
CN 1729584 A 2/2006
(Continued)

OTHER PUBLICATIONS

First Office Action for Chinese Application No. 201710505815.9, dated Jul. 3, 2018, 5 Pages.
(Continued)

*Primary Examiner* — Anthony Ho
(74) *Attorney, Agent, or Firm* — Brooks Kushman P.C.

(57) ABSTRACT

The present disclosure provides a display substrate and a display device. The display substrate includes a first electrode structure, an organic light-emitting layer and a second electrode structure orderly arranged on a base substrate. The display substrate further includes a filter film located on a light-emitting side of the display substrate. A light absorption rate of a first electrode structure or a second electrode structure is greater than a first threshold.

17 Claims, 3 Drawing Sheets

5
4
3
2
11
1

(56) References Cited

U.S. PATENT DOCUMENTS

| | | | |
|---|---|---|---|
| 2006/0267485 | A1 | 11/2006 | Wood et al. |
| 2008/0218067 | A1 | 9/2008 | Lee et al. |
| 2009/0096359 | A1 | 4/2009 | Lee et al. |
| 2012/0280612 | A1 | 11/2012 | Lee et al. |
| 2014/0183460 | A1 | 7/2014 | Kim et al. |
| 2015/0325814 | A1 | 11/2015 | Yang et al. |
| 2016/0133880 | A1 | 5/2016 | Lee et al. |
| 2017/0155095 | A1 | 6/2017 | Tsai et al. |
| 2017/0373282 | A1 | 12/2017 | Kim et al. |
| 2018/0062116 | A1 | 3/2018 | Park et al. |

FOREIGN PATENT DOCUMENTS

| | | | |
|---|---|---|---|
| CN | 1280925 | C | 10/2006 |
| CN | 1866573 | A | 11/2006 |
| CN | 101262727 | A | 9/2008 |
| CN | 101540374 | A | 9/2009 |
| CN | 102034935 | A | 4/2011 |
| CN | 102270750 | A | 12/2011 |
| CN | 102714281 | A | 10/2012 |
| CN | 102969454 | A | 3/2013 |
| CN | 103474450 | A | 12/2013 |
| CN | 103915468 | A | 7/2014 |
| CN | 105206758 | A | 12/2015 |
| CN | 105590948 | A | 5/2016 |
| CN | 106784388 | A | 5/2017 |
| CN | 107195797 | A | 9/2017 |
| CN | 107546334 | A | 1/2018 |
| CN | 107799563 | A | 3/2018 |
| TW | 201719883 | A | 6/2017 |
| WO | 2011062351 | A1 | 5/2011 |

OTHER PUBLICATIONS

Second Office Action for Chinese Application No. 201710505815.9, dated Jan. 25, 2019, 6 Pages.

International Search Report and Written Opinion for Application No. PCT/CN2018/081886, dated Jun. 25, 2018, 12 Pages.

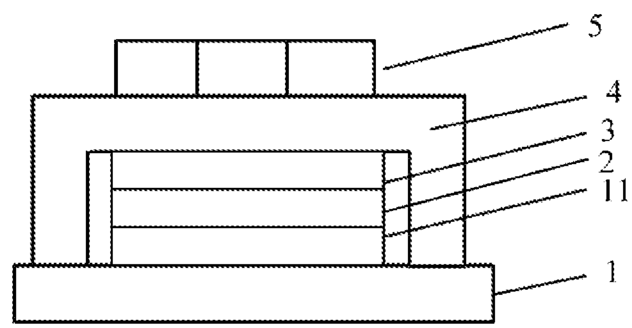
Fig. 1
8
7
6
Fig. 2
9
8
7
6
Fig. 3
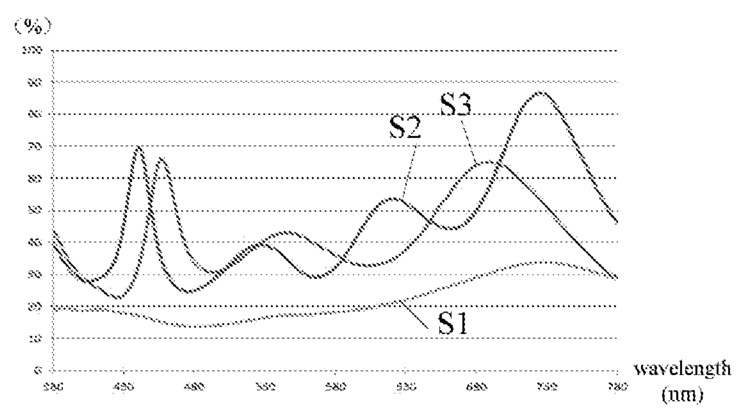
Fig. 4

10
8
7
6
Fig. 8
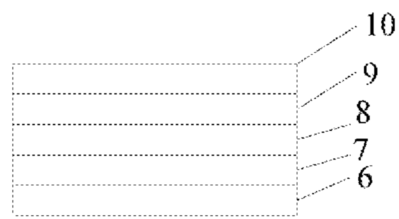
Fig. 9
13
7
12
Fig. 10
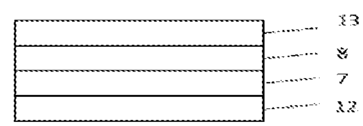
Fig. 11

DISPLAY SUBSTRATE AND DISPLAY DEVICE

CROSS-REFERENCE TO RELATED APPLICATION APPLICATIONS

This application is the U.S. national phase of PCT Application No. PCT/CN2018/081886 filed on Apr. 4, 2018, which claims priority to Chinese Patent Application No. 201710505815.9 filed on Jun. 28, 2017, which are incorporated herein by reference in their entireties.

TECHNICAL FIELD

The present disclosure relates to the field of display technology, in particular to a display substrate and a display device.

BACKGROUND

Currently, Organic Light-Emitting Diode (OLED) component is a type of display component that has received much interest, and has many advantages such as low power consumption, high contrast, wide viewing angle and so forth. OLED component has an organic light-emitting layer that is made of an organic light-emitting material. In the case that electrons and holes are combined in the organic light-emitting layer, the organic light-emitting layer emits light, thereby achieving the display function of the OLED component.

A top-emitting OLED component includes a transparent cathode, an organic functional layer and a high reflectivity anode. The high reflectivity anodes can improve the light-emitting efficiency of the OLED component, but ambient light surrounding the display device can also be reflected by the high reflectivity anode when illuminates the OLED component. The stronger the ambient light, the stronger the light reflected by the high reflectivity anode, which results in a decrease in display contrast of the OLED component and seriously affects the user experience.

A filter film arranged on the top-emitting OLED component can absorb part of the ambient light, but cannot absorb the light which has certain wavelength corresponding to the filter film. The light which has the certain wavelength will still be reflected by the high reflectivity anode through the filter film. In the case that the ambient light is strong, the display contrast will still be degraded seriously.

In order to ensure the contrast of the screen, the transparent cathode can be replaced by a black cathode with higher absorption rate to the ambient light. However, the cathode with the higher light absorption rate absorbs the light emitted from the OLED component as well as the ambient light, thereby causing the light-emitting efficiency of the OLED component degraded seriously.

SUMMARY

The object of the present disclosure is to provide an OLED display component and a display device capable of ensuring both the light-emitting efficiency of the OLED component and the display contrast of the display device.

In one aspect, at least one embodiment of the present disclosure provides a display substrate. The display substrate includes a first electrode structure, an organic light-emitting layer and a second electrode structure sequentially arranged on a base substrate. The display substrate further includes a filter film located on a light-emitting side of the display substrate. A light absorption rate of a first electrode structure or a second electrode structure is greater than a first threshold.

Optionally, in some embodiments, in the case that the light absorption rate of the second electrode structure located on a light-emitting side of the display substrate is greater than the first threshold, in a direction from a side close to the organic light-emitting layer to a side away from the organic light-emitting layer, the second electrode structure includes a second transparent electrode film, a phase difference layer and a light absorbing layer in order. A thickness of the phase difference layer is an odd multiple of a half wavelength of visible light. The light reflectivity of the light absorbing layer is lower than a second threshold, and the light absorption rate of the light absorbing layer to light emitted by the organic light-emitting layer is less than a third threshold.

Optionally, in some embodiments, the display substrate includes green pixel regions, red pixel regions, and blue pixel regions. In the green pixel region, the display substrate further includes a reflective absorbing film located on a side of the light absorbing layer away from the organic light-emitting layer. Microcavities are formed between the reflective absorbing film and the second transparent electrode film. The light reflectivity of the reflective absorbing film is less than a fourth threshold. The light absorption rate of the reflective absorbing film to ambient light is greater than a fifth threshold.

Optionally, in some embodiments, the second electrode structure further includes a light auxiliary layer located on the light-emitting side of the display substrate. The light auxiliary layer is configured to improve light-emitting efficiency of the display substrate.

Optionally, in some embodiments, in the case that the light absorption rate of the first electrode structure located on a non-light-emitting side of the display substrate is greater than the first threshold, in a direction from a side close to the organic light-emitting layer to a side away from the organic light-emitting layer, the first electrode structure includes a first transparent electrode film, a phase difference layer and a reflective film in order. A thickness of the phase difference layer is an odd multiple of a half wavelength of visible light. The light reflectivity of the reflective film is greater than a sixth threshold.

Optionally, in some embodiments, the first electrode structure further includes a light absorbing layer located between the first transparent electrode film and the phase difference layer. The light reflectivity of the light absorbing layer is less than a second threshold, and the light absorption rate of the light absorbing layer is less than a third threshold. At the light absorbing layer, light reflected by the interface between the light absorbing layer and the phase difference layer interferes with the light passing through the phase difference layer and reflected by the reflective film.

Optionally, in some embodiments, the phase difference layer is made of $Alq_3$, $MoO_3$, LiF or $MgF_2$.

Optionally, in some embodiments, the light absorbing layer is made of $Alq_3$ doped with Ag.

Optionally, in some embodiments, the reflective absorbing film is made of Al, Cr or AgMg.

Optionally, in some embodiments, the first electrode structure is an anode; the second electrode structure is a cathode, and the first threshold is 40% or 45%.

Optionally, in some embodiments, the second threshold is 30%; the third threshold is 15%.

Optionally, in some embodiments, the fourth threshold is 20%; the fifth threshold is 1.5%.

Optionally, in some embodiments, the light reflectivity of the reflective absorbing film is 2% to 20%; the light absorption rate is 1.5%-15%.

Optionally, in some embodiments, the light auxiliary layer is made of an inorganic material, such as ZnSe or Lif, or organic material.

Optionally, in some embodiments, the sixth threshold is 90%.

The embodiments of the present disclosure further disclose a display device including the display substrate as described above.

The embodiments of the present disclosure have the following beneficial effects: in the above technical solutions, an electrode structure having a high light absorption rate is combined with a filter film. The ambient light is mostly absorbed after passing through the filter film. Then the ambient light is further absorbed by the electrode structure. Since the filter film has absorbed most of the ambient light, a requirement to the light reflectivity of the display substrate to the ambient light can be met without setting a high light absorption rate of the electrode structure, thereby maintaining the light-emitting efficiency of the OLED component.

BRIEF DESCRIPTION OF THE DRAWINGS

FIG. 1 is a schematic structural view showing a display substrate according to an embodiment of the present disclosure;

FIG. 2 is a schematic structural view showing cathode structures of a red sub-pixel and a blue sub-pixel according to an embodiment of the present disclosure;

FIG. 3 is a schematic structural view showing a cathode structure of a green sub-pixel according to an embodiment of the present disclosure;

FIG. 4 is a curve graph showing light absorption rates of cathode structures of the red sub-pixel and the blue sub-pixel according to the embodiment of the present disclosure;

FIG. 8 is a schematic diagram showing cathode structures of a red sub-pixel and a blue sub-pixel according to an embodiment of the present disclosure;

FIG. 9 is a schematic diagram showing a cathode structure of a green sub-pixel according to an embodiment of the present disclosure;

FIG. 10 is a schematic diagram showing an anode structure according to another embodiment of the present disclosure;

FIG. 11 is a schematic diagram showing a anode structure according to another embodiment of the present disclosure;

DETAILED DESCRIPTION

Figure 5:
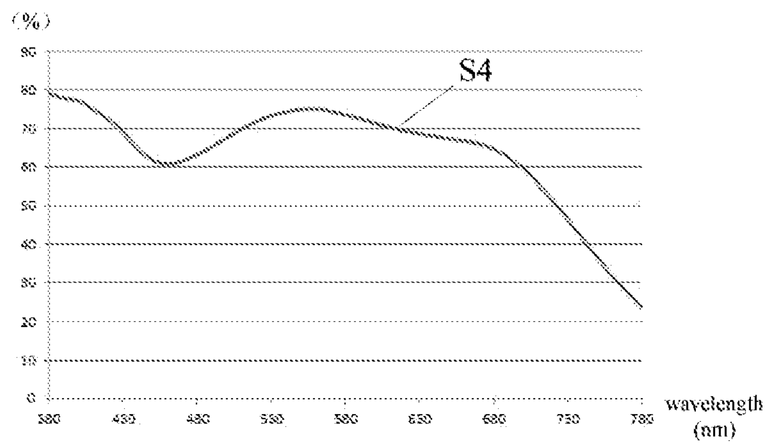
FIG. 5 is a curve graph showing light transmittance rates of cathode structures of a red sub-pixel and a blue sub-pixel according to an embodiment of the present disclosure.

In order to make the technical problems to be solved, technical solutions and advantages of the embodiments of the present disclosure more apparent, the detailed description will be made below in conjunction with the drawings and the specific embodiments.

In view of the insufficient light-emitting efficiency of the OLED component in the related art, embodiments of the present disclosure provide an OLED display component and a display device, which is capable of ensuring both the light-emitting efficiency of the OLED component and the display contrast of the display device.

The embodiments of the present disclosure provide a display substrate including a first electrode structure, an organic light-emitting layer and a second electrode structure sequentially arranged on a base substrate. The display substrate further includes a filter film located on a light-emitting side of the display substrate. The light absorption rate of a first electrode structure or a second electrode structure is greater than a first threshold.

Specifically, in the case that the first electrode structure is an anode and the second electrode structure is a cathode, the light absorption rate of the first electrode structure to the ambient light is required to be greater than 40%. In other words, in the case that the light absorption rate of the first electrode structure is greater than the first threshold, the first threshold is 40%; or the light absorption rate of the second electrode structure is required to be greater than 45%. While the light absorption rate to the light emitted by the OLED is required to be less than 30%. In other words, in the case that the light absorption rate of the second electrode structure is greater than the first threshold, the first threshold is 45%.

In the present embodiment, an electrode structure having a high light absorption rate is combined with a filter film. The ambient light is mostly absorbed after passing through the filter film. Then the ambient light is further absorbed by the electrode structure. Since the filter film has absorbed most of the ambient light, a requirement to the light reflectivity of the display substrate to the ambient light can be met without setting a high light absorption rate of the electrode structure, thereby maintaining the light-emitting efficiency of the OLED component.

Since the filter film and the electrode structure can be made very thin, flexible display can be easily realized. The first electrode structure and the second electrode structure have a relatively simple structure, and can be formed by only a few layers of thin films, which is easy to implement in the process. In addition, filter film technology is very mature in the display industry, so the implementation cost of the filter film is very low.

Optionally, in some embodiments, in the case that the light absorption rate of the second electrode structure located on a light-emitting side of the display substrate is greater than the first threshold, in a direction from a side close to the organic light-emitting layer to a side away from the organic light-emitting layer, the second electrode structure includes a second transparent electrode film, a phase difference layer and a light absorbing layer in order. A thickness of the phase difference layer is an odd multiple of a half wavelength of visible light. The phase difference layer is made of $Alq_3$, $MoO_3$, LiF or $MgF_2$. The light reflectivity of the light absorbing layer is lower than a second threshold, and the light absorption rate of the light absorbing layer is less than a third threshold. The second threshold could be 30%, and the third threshold could be 15%. The ambient light is reflected on the upper and lower surfaces of the phase difference layer. In the case that the thickness of the phase difference layer is an odd multiple of a half wavelength of the light $\lambda/2$, destructive interference occurs between the two reflected lights. The two reflected lights are absorbed by the light absorbing layer to the utmost extent. Although the light absorbing layer with a high light absorption rate can absorb a large amount of ambient light, it can also absorbs the light emitted by the organic light-emitting layer, thereby causing a low light-emitting efficiency of the OLED. Therefore, the light absorption rate of the light absorbing layer cannot be too much high. Optionally, the light absorption rate of the light absorbing layer is 5% to 15% and the light reflectivity of the light absorbing layer is 5% to 30%. A film having a low light reflectivity and a low light absorption coefficient, such as an $Alq_3$ film doped with Ag, or the like, can be used as the light absorbing layer. The thickness of the light absorbing layer could be 10 nm to 200 nm.

Optionally, in some embodiments, the display substrate includes green pixel regions, red pixel regions, and blue pixel regions. In the green pixel region, the display substrate further includes a reflective absorbing film located on a side of the light absorbing layer away from the organic light-emitting layer. Microcavities are formed between the reflective absorbing film and the second transparent electrode film. The light reflectivity of the reflective absorbing film is less than a fourth threshold. The fourth threshold could be 20%. The light absorption rate of the reflective absorbing film is greater than a fifth threshold. The fifth threshold could be 1.5%. Since little green light is absorbed by the light absorbing layer, the reflective absorbing film is provided in the green pixel region. Weak microcavities are formed between the reflective absorbing film and the electrode film to increase light absorption. Optionally, the light reflectivity of the reflective absorbing film is 2% to 20% and the light absorption rate of 1.5% to 15%, the reflective absorbing film could be made of a thin metal material having a high light absorption coefficient, such as Al, Cr, AgMg or the like. The thickness of the reflective absorbing film can be 1 nm to 30 nm.

Optionally, in some embodiments, the second electrode structure further includes a light auxiliary layer located on the light-emitting side of the display substrate. The light auxiliary layer is configured to and is enable to improve light-emitting efficiency of the display substrate. The thickness of the light auxiliary layer could be 10 nm to 200 nm, which is provided for adjusting the light absorption rate and the light reflectivity of the second electrode structure to the ambient light and the light emitted by the OLED. Specifically, the light auxiliary layer can be made of inorganic or organic materials, such as ZnSe, LiF or the like.

Optionally, in some embodiments, the light absorption rate of the first electrode structure located on a non-light-emitting side of the display substrate is greater than the first threshold. In a direction from a side close to the organic light-emitting layer to a side away from the organic light-emitting layer, the first electrode structure includes a first transparent electrode film, a phase difference layer and a reflective film in order. A thickness of the phase difference layer is an odd multiple of a half wavelength of visible light. The light reflectivity of the reflective film is greater than a sixth threshold. The sixth threshold could be 90%. Specifically, the light reflectivity of the reflective film is 90%-100%. The light reflected by the interface between the first transparent electrode film and the phase difference layer interferes with the light passing through the phase difference layer and reflected by the reflective film, and is absorbed largely by the first transparent electrode at last.

Optionally, in some embodiments, the first electrode structure further includes a light absorbing layer located between the first transparent electrode film and the phase difference layer. The light reflectivity of the light absorbing layer is less than a second threshold, and the light absorption rate of the light absorbing layer is less than a third threshold. At the light absorbing layer, light reflected by the interface between the light absorbing layer and the phase difference layer interferes with the light passing through the phase difference layer and reflected by the reflective film, and is absorbed largely by the light absorbing layer at last. Although the light absorbing layer with a high light absorption rate can absorb a large amount of ambient light, it can also absorbs the light emitted by the organic light-emitting layer, thereby causing a low light-emitting efficiency of the OLED. Therefore, the light absorption rate of the light absorbing layer cannot be too high. Optionally, the light absorption rate of the light absorbing layer is 5% to 15% and the light reflectivity of the light absorbing layer is 5% to 30%. A film having a low light reflectivity and a low light absorption rate, such as an $Alq_3$ film doped with Ag, or the like, can be used as the light absorbing layer. The thickness of the light absorbing layer could be 10 nm to 200 nm.

The technical solution of the present disclosure may be implemented in two ways: in one embodiment the light absorption rate of the anode of the display substrate is designed to be relatively high; in the other embodiment the light absorption rate of the cathode of the display substrate is designed to be relatively high. The specific embodiments of the present disclosure are detailed hereinafter in conjunction with drawings. It should be understood that the described embodiments are merely for illustrating the present disclosure, rather than limiting the present disclosure.

Embodiment 1

In this embodiment, the light absorption rate of the cathode structure on the light-emitting side of the display substrate is designed to be relatively high, while the light absorption rate of the anode structure could be designed to be relatively low (lower than 10%), and the light reflectivity of the anode structure could be designed to be relatively high (higher than 90%). As shown in FIG. 1, the method for manufacturing the display substrate of this embodiment includes the following steps: cleaning and drying the substrate 1 on which the array circuit is formed, then placing the substrate 1 into a chamber with high vacuum, evaporating the anode structure 11 and evaporating the organic functional layer 2, and evaporating the cathode structure 3 after the organic functional layer 2 is evaporated. FIG. 2 is a schematic diagram showing cathode structures of a red sub-pixel and a blue sub-pixel. FIG. 3 is a schematic diagram showing a cathode structure of a green sub-pixel.

As shown in FIG. 2, the steps for manufacturing the cathode structure of the red sub-pixel and the blue sub-pixel includes: firstly evaporating the transparent cathode film 6 with a thickness of 5 nm to 30 nm, such as a translucent AgMg composite cathode film, an Ag cathode film, or the like, then evaporating the phase difference layer 7 and the light absorbing layer 8 in order on the red sub-pixel and the blue sub-pixel using a masking plate. The phase difference layer 7 is made of $Alq_3$, $MoO_3$, LiF or $MgF_2$. The light absorbing layer 8 is made of $Alq_3$ doped with Ag. The light is reflected on the upper and lower surfaces of the phase difference layer 7. In the case that the thickness of the phase difference layer is an odd multiple of a half wavelength of the light $\lambda/2$, destructive interference occurs between the two reflected lights. The two reflected lights are absorbed by the light absorbing layer 8 to the utmost extent. The thickness of the light absorbing layer 8 is 10 nm to 200 nm. The light reflectivity of the light absorbing layer 8 cannot be too high. Otherwise the ambient light and the light emitted by the OLED will be reflected back, and then is absorbed by the cathode structure, resulting in a high light reflectivity of ambient light and a low light-emitting efficiency of the OLED. The light absorbing layer with the high absorption rate can absorb a large amount of ambient light, but also absorbs the light emitted by the OLED, thereby causing the low light-emitting efficiency of the OLED. Therefore, an $Alq_3$ film doped with Ag or the like having a low light reflectivity and a low light absorption rate, such as 5% to 30% light reflectivity and 5% to 15% light absorption rate, can be used as the light absorbing layer 8.

As shown in FIG. 3, the specific steps for manufacturing the cathode structure of the green sub-pixel includes: firstly evaporating a transparent cathode film 6 having a thickness of 5 nm to 30 nm, such as a translucent AgMg composite cathode film, an Ag cathode film, or the like, then evaporating the phase difference layer 7, the light absorbing layer 8 and the reflective absorbing film 9 on the green sub-pixel in order using a masking plate. The phase difference layer 7 is made of $Alq_3$, $MoO_3$, LiF or MgF2. The light absorbing layer 8 is made of $Alq_3$ doped with Ag. The light is reflected on the upper and lower surfaces of the phase difference layer 7. In the case that the thickness of the phase difference layer is an odd multiple of a half wavelength of the light $\lambda/2$, destructive interference occurs between the two reflected lights. The two reflected lights are absorbed by the light absorbing layer 8 to the utmost extent. The thickness of the light absorbing layer 8 is 10 nm to 200 nm. The light reflectivity of the light absorbing layer 8 cannot be too high. Otherwise the ambient light and the light emitted by the OLED will be reflected back, and then is absorbed by the cathode structure, resulting in a high light reflectivity of ambient light and a low light-emitting efficiency of the OLED. The light absorbing layer with the high absorption rate can absorb a large amount of ambient light, but also absorbs the light emitted by the OLED, thereby causing the low light-emitting efficiency of the OLED. Therefore, an $Alq_3$ film doped with Ag or the like having a low light reflectivity and a low light absorption rate can be used as the light absorbing layer 8. The thickness of the reflective absorbing film 9 is from 1 nm to 30 nm. Weak microcavities are formed between the reflective absorbing film and the electrode film to increase light absorption. For the same reason as the light absorbing layer 8, the light reflectivity of the reflective absorbing film 9 cannot be set too high. Thus, the reflective absorbing film 9 could be made of a thin metal material having a high light absorption rate, such as Al, Cr, AgMg or the like.

After manufacturing the cathode structure, a film encapsulation layer 4 and a filter film 5 can be formed.

Figure 6:
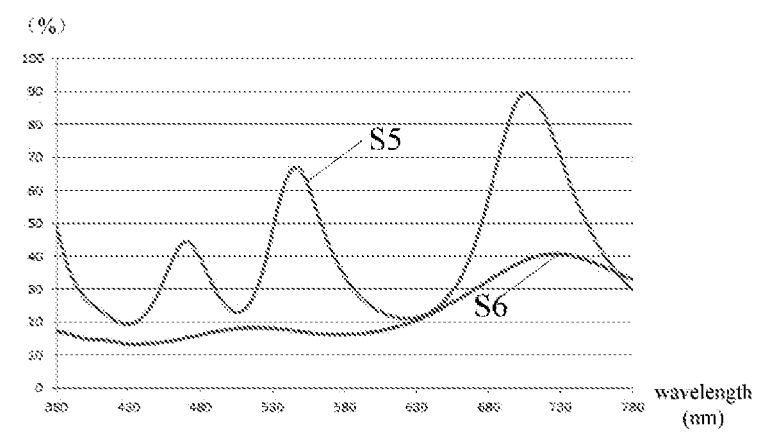
FIG. 6 is a curve graph showing a light absorption rate of a cathode structure of the green sub-pixel according to the embodiment of the present disclosure.
Figure 7:
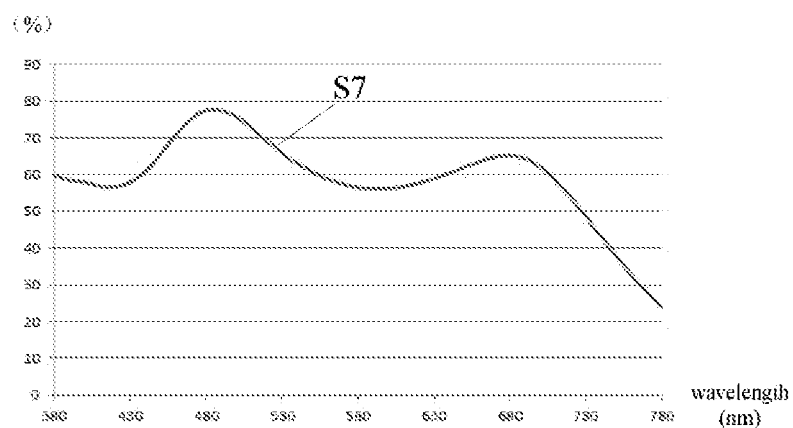
FIG. 7 is a curve graph showing a light transmittance rates of a cathode structure of the green sub-pixel according to the embodiment of the present disclosure.

The performances of the cathode structures of the red sub-pixel, the blue sub-pixel and the green sub-pixel are simulated, and the simulation results are shown in FIGS. 4-7. FIG. 4 is a curve graph showing light absorption rates of cathode structures of the red sub-pixel and the blue sub-pixel; FIG. 5 is a curve graph showing light transmittance rates of cathode structures of a red sub-pixel and a blue sub-pixel; FIG. 6 is a curve graph showing a light absorption rate of a cathode structure of the green sub-pixel; FIG. 7 is a curve graph showing a light transmittance rates of a cathode structure of the green sub-pixel. S1 is a curve showing a light absorption rate of cathode structure of the blue sub-pixel and the red sub-pixel. The light absorption rate of cathode structure of the blue sub-pixel and the red sub-pixel to blue light having a wavelength of 460 nm is 14.8%. The blue light is emitted from the display substrate. The light absorption rate of cathode structure of the blue sub-pixel and the red sub-pixel to red light having a wavelength of 630 nm is 22.1%. The red light is emitted from the display substrate. S2 is a curve showing a light absorption rate of the cathode structure of the red sub-pixel to the ambient light. The light absorption rate of cathode structure of the red sub-pixel to red ambient light having a wavelength of 630 nm is 52.3%. And the light absorption rate of cathode structure of the red sub-pixel to red ambient light having a wavelength of 620 nm is 53.6%. S3 is a curve showing a light absorption rate of the cathode structure of the blue sub-pixel to the ambient light. The light absorption rate of cathode structure of the blue sub-pixel to blue ambient light having a wavelength of 460 nm is 63.9%. S4 is a curve graph showing light transmittance rate of cathode structure of a red sub-pixel and a blue sub-pixel, in which the light is emitted by the display substrate. The light transmittance rate of cathode structure of a red sub-pixel and a blue sub-pixel to blue light having a wavelength of 460 nm is 61%. The light transmittance rate of cathode structure of a red sub-pixel and a blue sub-pixel to red light having a wavelength of 620 nm is 69.5%. And the light transmittance rate of cathode structure of a red sub-pixel and a blue sub-pixel to red light having a wavelength of 630 nm is 68.8%. S5 is a curve showing a light absorption rate of the cathode structure of the green sub-pixel to the ambient light. The light absorption rate of the cathode structure of the green sub-pixel to green light having a wavelength of 530 nm is 47.2%. S6 is a curve graph showing light absorption rate of cathode structure of a green sub-pixel, in which the light is emitted by the display substrate. The light absorption rate of cathode structure of a green sub-pixel to green light having a wavelength of 530 nm is reduced to 18.1%. S7 is a curve graph showing light transmittance rates of cathode structures of a green sub-pixel, in which the light is emitted by the display substrate. The light transmittance rates of cathode structures of a green sub-pixel to green light having a wavelength of 530 nm can reach up to 65.9%.

In order to ensure a low light absorption rate of the cathode structure to the light emitted from the OLED, the absorption rate of the cathode structure to ambient light cannot reach to 90%. The absorption of the cathode structure with the filter film can meet the requirement of overall light reflectivity of the OLED display substrate.

Optionally, as shown in FIG. 8 and FIG. 9, in some embodiments, after the cathode structure is evaporated, a light auxiliary layer 10 can be added on the cathode structure for adjusting the light absorption rate and the light reflectivity of the cathode structure to the ambient light and light emitted by the OLED. The thickness of the light auxiliary layer 10 is from 10 nm to 200 nm.

Embodiment 2

In this embodiment, the light absorption rate of the anode structure on the non-light-emitting side of the display substrate is designed to be relatively high, while the light absorption rate of the cathode structure could be designed to be relatively low (lower than 20%), and the light reflectivity of the cathode structure could be designed to be relatively high (higher than 50%). As shown in FIG. 1, the method for manufacturing the display substrate of this embodiment includes the following steps: cleaning and drying the substrate 1 of the circuit, then placing the substrate 1 into a chamber with high vacuum, evaporating the anode structure 11 and evaporating the organic functional layer 2, and evaporating the cathode structure 3 after the organic functional layer 2 is evaporated.

As shown in FIG. 10, for manufacturing the anode structure, firstly a reflective film 12 is formed on the substrate 1; then a phase difference layer 7 having an odd multiple of a half wavelength $\lambda/2$ of the light is evaporated, the phase difference layer 7 could be made of an organic material, such as $Alq_3$, or an inorganic material, such as LiF or $MgF_2$; and then, evaporating a transparent anode film 13 having a thickness of 10 nm to 40 nm, the transparent anode film 13 could be made of Al, Cr, Ag or the like; after the anode structure 11 is formed, evaporating the organic functional layer 2 and the cathode structure 3 on the anode in order; and manufacturing the film encapsulation layer 4 and the filter film 5.

Optionally, in some embodiments, as shown in FIG. 11, the light absorbing layer 8 is formed between the transparent anode film 12 and the phase difference layer 7. The reflected light at the interface between the light absorbing layer 8 and the phase difference layer 7 interferes with the light passing through the phase difference layer 7 and reflected by the reflective film 12 at the light absorbing layer 8, and is absorbed by the light absorbing layer 8 at last.

In the present disclosure, the cathode structure or the anode structure with a high light absorption rate is combined with the filter film. Compared with solutions in which merely the electrode structure or the filter film with a high light absorption rate is used to reduce the light reflectivity of the OLED display substrate to the ambient light, the present solution can meet the requirements easily. Thus, flexible display can be easily realized and the loss of light-emitting efficiency can be reduced. The above embodiments are merely illustrative to the composition of the electrode structure. The composition of the electrode structure can be various, and is not limited by the above embodiment.

The embodiments of the present disclosure also provide a display device including the display substrate as described above. The display device may be any product or component having a display function, such as a television, a display, a digital photo frame, a mobile phone, a tablet computer, or the like. The display device also includes a flexible circuit board, a printed circuit board, and a backplane. The display device may also include other related electronic circuits or elements, such as power and driving circuits and the like.

Unless defined particularly, technical terms or scientific terms used in the present disclosure are intended to be understood in the ordinary meaning by those skilled in the art. The words "first," "second," and similar terms used in the present disclosure do not indicate any order, quantity or importance, but are merely used to distinguish different components. Similarly, the words "a" or "one" and the like do not indicate a quantity limitation, but mean that there is at least one. "Connect" or "couple" and the like are not limited to physical or mechanical connections, but may include electrical connections, whether direct or indirect. "Upper", "lower", "left", "right", etc. are merely used to indicate the relative positional relationship. When the absolute position of the object to be described is changed, the relative positional relationship is also changed accordingly.

It should be understood that in the case that one element, such as a layer, a film, a region, a substrate or the like, is referred to be located "on" or "under" the other element, that means the element can be "directly" located "on" or "under" the other element, or there is a middle element between the two elements.

The above is a preferred embodiment of the present disclosure. It should be noted that a number of modifications and refinements may be made by those skilled in the art without departing from the principles of the present disclosure, and such modifications and refinements are also considered to be within the scope of the present disclosure.

What is claimed is:

1. A display substrate, comprising a first electrode structure, an organic light-emitting layer and a second electrode structure sequentially arranged on a base substrate, the display substrate further comprising a filter film located on a light-emitting side of the display substrate; wherein a light absorption rate of the first electrode structure or the second electrode structure is greater than a first threshold, wherein the first electrode structure is an anode; the second electrode structure is a cathode, and the first threshold is 40% or 45%.

2. The display substrate according to claim 1, wherein in the case that the light absorption rate of the second electrode structure located on the light-emitting side of the display substrate is greater than the first threshold, in a direction from a side close to the organic light-emitting layer to a side away from the organic light-emitting layer, the second electrode structure sequentially comprises:

a second transparent electrode film, a phase difference layer, a thickness of the phase difference layer being an odd multiple of a half wavelength of visible light; and a light absorbing layer, wherein light reflectivity of the light absorbing layer is lower than a second threshold, and a light absorption rate of the light absorbing layer to light emitted by the organic light-emitting layer is less than a third threshold.

3. The display substrate according to claim 2, wherein the display substrate comprises green pixel regions, red pixel regions, and blue pixel regions; in each green pixel region, the display substrate further comprises a reflective absorbing film located on a side of the light absorbing layer away from the organic light-emitting layer; microcavities are formed between the reflective absorbing film and the second transparent electrode film; light reflectivity of the reflective absorbing film is less than a fourth threshold; and a light absorption rate of the reflective absorbing film to ambient light is greater than a fifth threshold.

4. The display substrate according to claim 2, wherein the second electrode structure further comprises a light auxiliary layer located on the light-emitting side of the display substrate; and the light auxiliary layer is configured to improve light-emitting efficiency of the display substrate.

5. The display substrate according to claim 1, wherein the light absorption rate of the first electrode structure located on a non-light-emitting side of the display substrate is greater than the first threshold, wherein in a direction from a side close to the organic light-emitting layer to a side away from the organic light-emitting layer, the first electrode structure sequentially comprises:

a first transparent electrode film, a phase difference layer, a thickness of the phase difference layer being an odd multiple of a half wavelength of visible light; and a reflective film, light reflectivity of the reflective film being greater than a sixth threshold.

6. The display substrate according to claim 5, wherein the first electrode structure further comprises a light absorbing layer located between the first transparent electrode film and the phase difference layer; light reflectivity of the light absorbing layer is less than a second threshold, and a light absorption rate of the light absorbing layer is less than a third threshold; and at the light absorbing layer, light reflected by an interface between the light absorbing layer and the phase difference layer interferes with the light passing through the phase difference layer and reflected by the reflective film.

7. The display substrate according to claim 2, wherein the phase difference layer is made of $Alq_3$, $MoO_3$, LiF or $MgF_2$.

8. The display substrate according to claim 2, wherein the light absorbing layer is made of $Alq_3$ doped with Ag.

9. The display substrate according to claim 3, wherein the reflective absorbing film is made of Al, Cr or AgMg.

10. The display substrate according to claim 2, wherein the second threshold is 30%; and the third threshold is 15%.

11. The display substrate according to claim 3, wherein the fourth threshold is 20%; and the fifth threshold is 1.5%.

12. The display substrate according to claim 3, wherein the light reflectivity of the reflective absorbing film is 2% to 20%; and the light absorption rate is 1.5%-15%.

13. The display substrate according to claim 4, wherein the light auxiliary layer is made of an inorganic material, such as ZnSe or LiF, or an organic material.

14. The display substrate according to claim 5, wherein the sixth threshold is 90%.

15. A display device, comprising the display substrate according to claim 1.

16. A display substrate, comprising a first electrode structure, an organic light-emitting layer and a second electrode structure sequentially arranged on a base substrate, the display substrate further comprising a filter film located on a light-emitting side of the display substrate; wherein a light absorption rate of the first electrode structure or the second electrode structure is greater than a first threshold, wherein in the case that the light absorption rate of the second electrode structure located on the light-emitting side of the display substrate is greater than the first threshold, in a direction from a side close to the organic light-emitting layer to a side away from the organic light-emitting layer, the second electrode structure sequentially comprises:

a second transparent electrode film, a phase difference layer, a thickness of the phase difference layer being an odd multiple of a half wavelength of visible light; and a light absorbing layer, wherein light reflectivity of the light absorbing layer is lower than a second threshold, and a light absorption rate of the light absorbing layer to light emitted by the organic light-emitting layer is less than a third threshold, wherein the second threshold is 30%; and the third threshold is 15%.

17. A display substrate, comprising a first electrode structure, an organic light-emitting layer and a second electrode structure sequentially arranged on a base substrate, the display substrate further comprising a filter film located on a light-emitting side of the display substrate; wherein a light absorption rate of the first electrode structure or the second electrode structure is greater than a first threshold, wherein the light absorption rate of the first electrode structure located on a non-light-emitting side of the display substrate is greater than the first threshold, wherein in a direction from a side close to the organic light-emitting layer to a side away from the organic light-emitting layer, the first electrode structure sequentially comprises:

a first transparent electrode film, a phase difference layer, a thickness of the phase difference layer being an odd multiple of a half wavelength of visible light; and a reflective film, light reflectivity of the reflective film being greater than a sixth threshold, wherein the first electrode structure further comprises a light absorbing layer located between the first transparent electrode film and the phase difference layer; light reflectivity of the light absorbing layer is less than a second threshold, and a light absorption rate of the light absorbing layer is less than a third threshold; and at the light absorbing layer, light reflected by an interface between the light absorbing layer and the phase difference layer interferes with the light passing through the phase difference layer and reflected by the reflective film.

* * * * *